US011776910B2

(12) United States Patent
Tsai et al.

(10) Patent No.: US 11,776,910 B2
(45) Date of Patent: Oct. 3, 2023

(54) PARTIAL BARRIER FREE VIAS FOR COBALT-BASED INTERCONNECTS AND METHODS OF FABRICATION THEREOF

(71) Applicant: Taiwan Semiconductor Manufacturing Co., Ltd., Hsin-Chu (TW)

(72) Inventors: Tsung-Ling Tsai, Hsinchu (TW); Shen-Nan Lee, Hsinchu County (TW); Mrunal A. Khaderbad, Hsinchu (TW); Chung-Wei Hsu, Hsinchu (TW); Chen-Hao Wu, Hsinchu (TW); Teng-Chun Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 212 days.

(21) Appl. No.: 17/313,558

(22) Filed: May 6, 2021

(65) Prior Publication Data

US 2021/0257302 A1 Aug. 19, 2021

Related U.S. Application Data

(62) Division of application No. 16/399,697, filed on Apr. 30, 2019, now Pat. No. 11,004,794.

(Continued)

(51) Int. Cl.
*H01L 23/535* (2006.01)
*H01L 23/528* (2006.01)
(Continued)

(52) U.S. Cl.
CPC ........ *H01L 23/535* (2013.01); *H01L 21/7684* (2013.01); *H01L 21/76805* (2013.01);
(Continued)

(58) Field of Classification Search
CPC .................. H01L 23/535; H01L 23/5226; H01L 23/5283
See application file for complete search history.

(56) References Cited

U.S. PATENT DOCUMENTS 6,133,139 A * 10/2000 Dalal .................. H01L 23/5226
438/622
9,355,893 B1 5/2016 Chen et al.
(Continued)

FOREIGN PATENT DOCUMENTS

CN 1449034 A 10/2003
CN 103811461 A 5/2014
(Continued)

*Primary Examiner* — Dale E Page
*Assistant Examiner* — Wilner Jean Baptiste
(74) *Attorney, Agent, or Firm* — HAYNES AND BOONE, LLP

(57) ABSTRACT

Partial barrier-free vias and methods for forming such are disclosed herein. An exemplary interconnect structure of a multilayer interconnect feature includes a dielectric layer. A cobalt-comprising interconnect feature and a partial barrier-free via are disposed in the dielectric layer. The partial barrier-free via includes a first via plug portion disposed on and physically contacting the cobalt-comprising interconnect feature and the dielectric layer, a second via plug portion disposed over the first via plug portion, and a via barrier layer disposed between the second via plug portion and the first via plug portion. The via barrier layer is further disposed between the second via plug portion and the dielectric layer. The cobalt-comprising interconnect feature can be a device-level contact or a conductive line of the multilayer interconnect feature. The first via plug portion and the second via plug portion can include tungsten, cobalt, and/or ruthenium.

20 Claims, 8 Drawing Sheets

Related U.S. Application Data

(60) Provisional application No. 62/690,586, filed on Jun. 27, 2018.

(51) Int. Cl.
*H01L 23/522* (2006.01)
*H01L 23/532* (2006.01)
*H01L 21/768* (2006.01)

(52) U.S. Cl.
CPC .. *H01L 21/76816* (2013.01); *H01L 21/76847* (2013.01); *H01L 21/76879* (2013.01); *H01L 21/76895* (2013.01); *H01L 23/5226* (2013.01); *H01L 23/5283* (2013.01); *H01L 23/53209* (2013.01); *H01L 23/53252* (2013.01); *H01L 23/53266* (2013.01)

(56) References Cited

U.S. PATENT DOCUMENTS

| | | | |
|---|---|---|---|
| 9,514,983 | B2 | 12/2016 | Jezewski et al. |
| 2006/0251800 | A1 | 11/2006 | Weidman et al. |
| 2010/0038789 | A1 | 2/2010 | Cheng et al. |
| 2011/0269276 | A1 | 11/2011 | Kwon et al. |
| 2012/0077342 | A1 | 3/2012 | Gao et al. |
| 2012/0153483 | A1 | 6/2012 | Akolkar et al. |
| 2016/0307793 | A1 | 10/2016 | Huang et al. |
| 2017/0229372 | A1* | 8/2017 | Lee .................. H01L 23/53204 |
| 2017/0345739 | A1 | 11/2017 | Edelstein et al. |

FOREIGN PATENT DOCUMENTS

| | | |
|---|---|---|
| CN | 105336672 A | 2/2016 |
| CN | 107046019 A | 8/2017 |
| EP | 2731133 A3 | 11/2017 |
| KR | 20170095829 A | 8/2017 |
| TW | 200837881 A | 9/2008 |
| WO | 2016105400 A1 | 6/2016 |

* cited by examiner

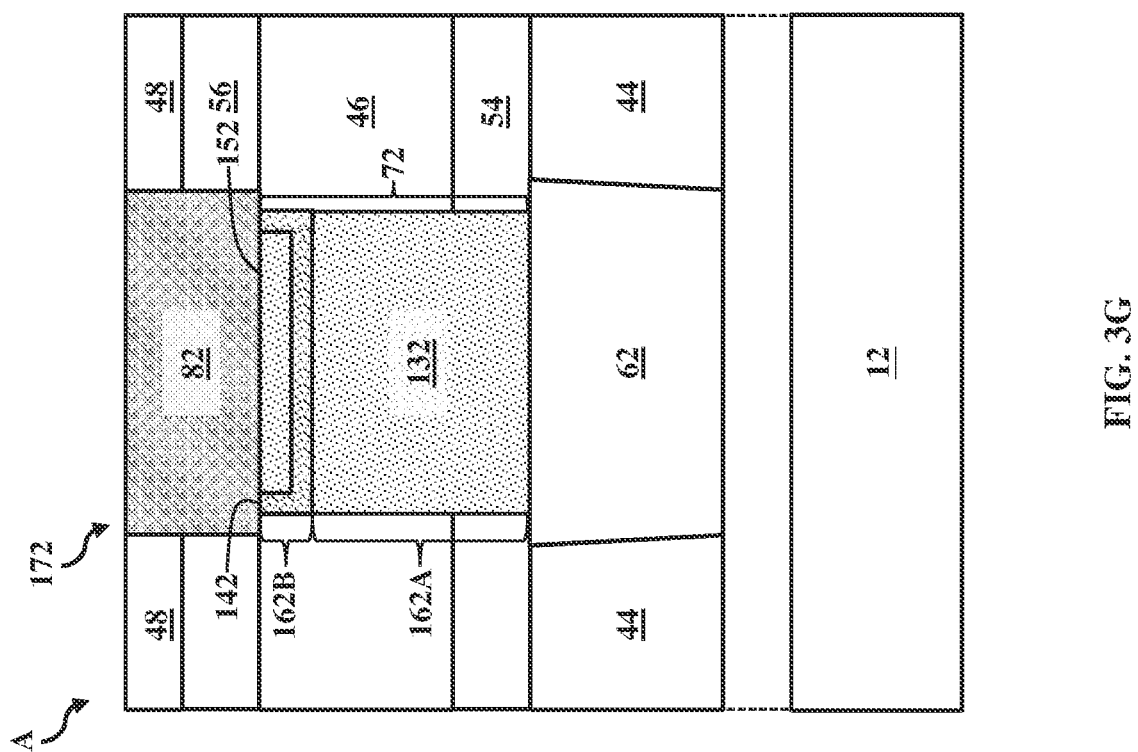

US 11,776,910 B2

PARTIAL BARRIER FREE VIAS FOR COBALT-BASED INTERCONNECTS AND METHODS OF FABRICATION THEREOF

This application is a divisional application of U.S. patent application Ser. No. 16/399,697, filed Apr. 30, 2019, which is a non-provisional application of and claims priority to U.S. Provisional Patent Application Ser. No. 62/690,586, filed Jun. 27, 2018, the entire disclosures of which are hereby incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, interconnects of the MLI features are exhibiting increased contact resistance, which presents performance, yield, and cost challenges. It has been observed that higher contact resistances exhibited by interconnects in advanced IC technology nodes can significantly delay (and, in some situations, prevent) signals from being routed efficiently to and from IC devices, such as transistors, negating any improvements in performance of such IC devices in the advanced technology nodes. Accordingly, although existing interconnects have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3G are enlarged fragmentary diagrammatic views of a portion A of the integrated circuit device of FIG. 1, in portion or entirety, when implementing the method of FIG. 2 to fabricate an interconnect structure of the integrated circuit device of FIG. 1, according to various aspects of the present disclosure.

DETAILED DESCRIPTION

Figure 1:
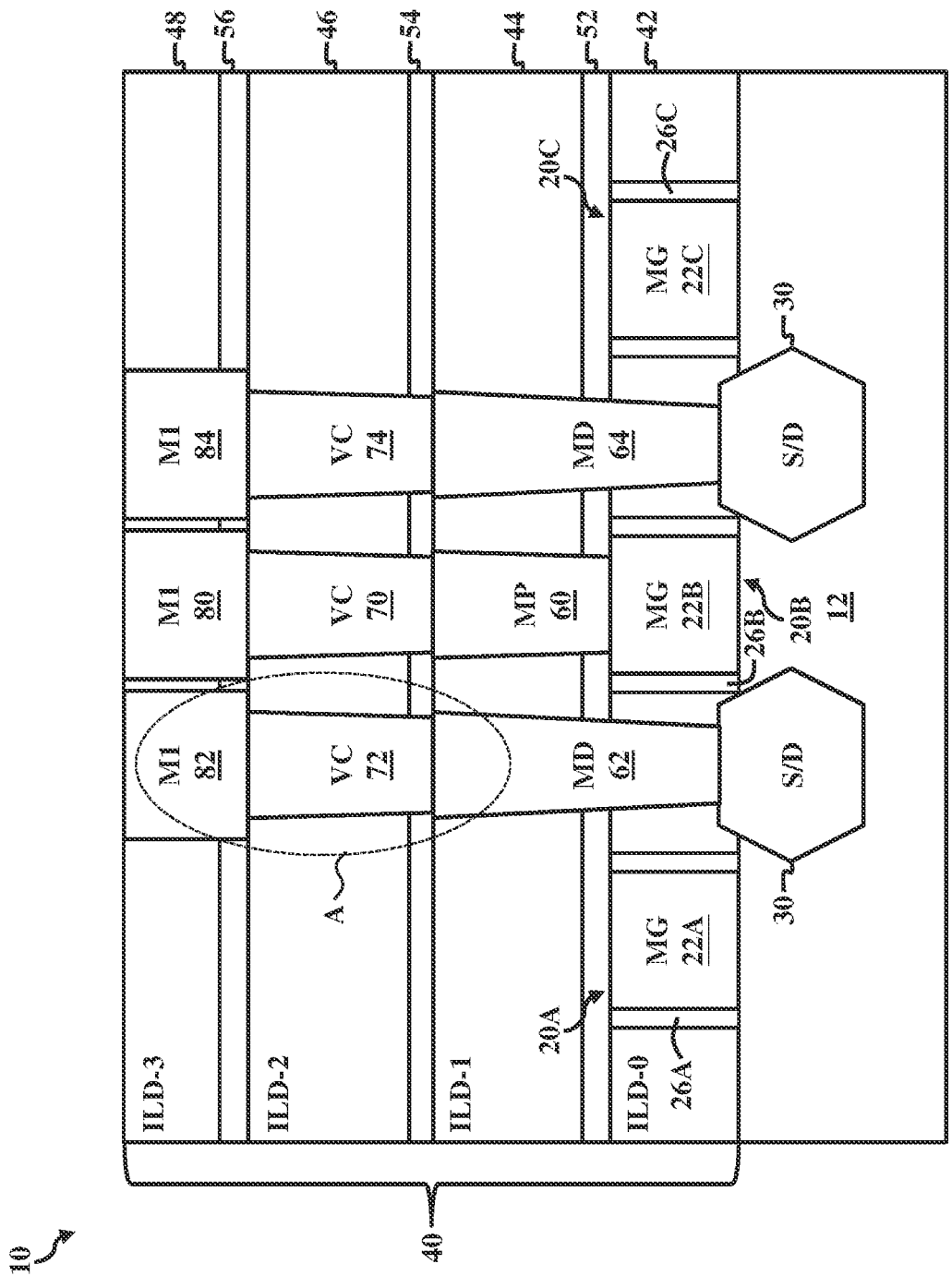
FIG. 1 is a fragmentary diagrammatic view of an integrated circuit device, in portion or entirety, according to various aspects of the present disclosure.

The present disclosure relates generally to integrated circuit (IC) devices, and more particularly, to vias for multi-layer interconnect features of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

As IC technologies progress towards smaller technology nodes, BEOL processes are experiencing significant challenges. For example, advanced IC technology nodes require more compact MLI features, which requires significantly reducing critical dimensions of interconnects of the MLI features (for example, widths and/or heights of vias and/or conductive lines of the interconnects). The reduced critical dimensions have led to significant increases in interconnect resistance, which can degrade IC device performance (for example, by increasing resistance-capacitance (RC) delay). Barrier-free vias have been proposed to replace conventional vias to lower interconnect resistance for advanced IC technology nodes. Conventional vias include a via barrier layer and a via plug, where the via barrier layer is disposed between (1) the via plug and an underlying interconnect feature (such as a device-level contact or a conductive line) and (2) the via plug and a dielectric layer (for example, an interlayer dielectric (ILD) layer and/or a contact etch stop layer (CESL)) in which the via is disposed. Barrier-free vias eliminate the via barrier liner and/or any other liner layer, such that the via plug directly contacts the underlying interconnect feature and the dielectric layer Eliminating the via barrier liner (along with other liner layers) increases a volume of the via plug, lowering resistance.

Though barrier-free vias exhibit desirably low resistance, sometimes, via plug materials, such as tungsten, cobalt, and/or ruthenium, do not adhere well to the dielectric layer, such that gaps (or voids) exist between the via plug and the dielectric layer. Poor adhesion of the via plug to the dielectric layer (in particular, to sidewall surfaces and/or bottom surfaces of a via opening in which the via plug is formed) can lead to significant damage of the underlying interconnect feature, particularly when the underlying interconnect feature includes cobalt. For example, when polishing the via plug materials (for example, by a chemical mechanical polishing (CMP) process), slurry used during the polishing has been observed to penetrate an interface between the via plug and the dielectric layer, seep through the gaps between the via plug and the dielectric layer, and attack material of the underlying interconnect feature (in particular, cobalt), degrading its performance. Such performance degradation can be calamitous for device-level contacts that include cobalt. For example, cobalt loss arising from exposure to chemicals during BEOL processing, such as CMP slurry (which is typically an acidic solution (in some implementations, having a pH value of about 2)), have been observed to cause significant yield loss of underlying interconnect features, which is unacceptable for meeting shrinking IC technology node demands. Planarization-induced delamination or peeling of the via plug materials, particularly at a wafer periphery, have also been observed as a result of the poor adhesion between the via plug materials and the dielectric layer.

The present disclosure discloses vias that protect underlying interconnect features (for example, device-level contacts and/or conductive lines), particularly underlying interconnect features that include cobalt, from post-process damage and remedy many issues that may arise with barrier-free vias. The partial barrier-free vias disclosed herein can prevent slurry used during planarization processes from penetrating the interface between a via plug and a dielectric layer and reduce planarization-induced peeling. In some implementations, the partial barrier-free vias disclosed herein include a floating via barrier layer that enhances adhesion between an upper portion of the partial barrier-free vias and a dielectric layer in which the partial barrier-free vias are disposed. The floating via barrier layer is disposed over a barrier-free via plug of the partial barrier-free via, such that the floating via barrier layer does not physically contact an underlying interconnect feature, such as a device-level contact that includes cobalt. The via plug thus maintains sufficient volume of the partial barrier-free vias, achieving low resistance characteristics similar to barrier-free vias. During fabrication of the partial barrier-free vias, the planarization processes are performed on a floating, omega-shaped via barrier layer (from which the floating via barrier layer is formed), which prevents damage to underlying conductive features and/or reduces peeling of via plug material. Different embodiments may have different advantages, and no particular advantage is required of any embodiment.

FIG. 1 is a fragmentary cross-sectional view of an IC device 10, in portion or entirety, according to various aspects of the present disclosure. IC device 10 can be included in a microprocessor, a memory, and/or other IC device. In some implementations, IC device 10 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs). FIG. 1 has been simplified for the sake of clarity to better understand the inventive concepts of the present disclosure. Additional features can be added in IC device 10, and some of the features described below can be replaced, modified, or eliminated in other embodiments of IC device 10.

IC device 10 includes a substrate (wafer) 12. In the depicted embodiment, substrate 12 includes silicon. Alternatively or additionally, substrate 12 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, substrate 12 includes one or more group III-V materials, one or more group II-IV materials, or combinations thereof. In some implementations, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 12 can include various doped regions (not shown) configured according to design requirements of IC device 10, such as p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, substrate 12 includes doped regions formed with a combination of p-type dopants and n-type dopants. The various doped regions can be formed directly on and/or in substrate 12, for example, providing a p-well structure, an n-well structure, a dual-well structure, a raised structure, or combinations thereof. An ion implantation process, a diffusion process, and/or other suitable doping process can be performed to form the various doped regions.

An isolation feature(s) (not shown) is formed over and/or in substrate 12 to isolate various regions, such as various device regions, of IC device 10. For example, isolation features define and electrically isolate active device regions and/or passive device regions from each other. Isolation features include silicon oxide, silicon nitride, silicon oxynitride, other suitable isolation material, or combinations thereof. Isolation features can include different structures, such as shallow trench isolation (STI) structures, deep trench isolation (DTI) structures, and/or local oxidation of silicon (LOCOS) structures. In some implementations, isolation features include STI features. For example, STI features can be formed by etching a trench in substrate 12 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation features. In some embodiments, STI features include a multi-layer structure that fills the trenches, such as a silicon nitride layer disposed over an oxide liner layer.

Various gate structures are disposed over substrate 12, such as a gate structure 20A, a gate structure 20B, and a gate structure 20C. In some implementations, one or more of gate structures 20A-20C interpose a source region and a drain region, where a channel region is defined between the source region and the drain region. The one or more gate structures 20A-20C engage the channel region, such that current can flow between the source/drain regions during operation. In some implementations, gate structures 20A-20C are formed over a fin structure, such that gate structures 20A-20C each wrap a portion of the fin structure. For example, one or more of gate structures 20A-20C wrap channel regions of the fin structure, thereby interposing source regions and drain regions of the fin structure. Gate structures 20A-20C include metal gate (MG) stacks, such as a metal gate stack 22A, a metal gate stack 22B, and a metal gate stack 22C. Metal gate stacks 22A-22C are configured to achieve desired functionality according to design requirements of IC device 10, such that metal gate stacks 22A-22C include the same or different layers and/or materials. In some implementations, metal gate stacks 22A-22C include a gate dielectric and a gate electrode. The gate dielectric is disposed on substrate 12, and the gate electrode is disposed on the gate dielectric. In some implementations, the gate dielectric is conformally disposed on sidewall surfaces and bottom surfaces of IC device 10 defining metal gate stacks 22A-22C, such that the gate dielectric is generally u-shaped and has a substantially uniform thickness. The gate dielectric includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide ($k \approx 3.9$). Exemplary high-k dielectric materials include hafnium, aluminum, zirconium, lanthanum, tantalum, titanium, yttrium, oxygen, nitrogen, other suitable constituent, or combinations thereof. In some implementations, the gate dielectric includes a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2—Al_2O_3$, $TiO_2$, $Ta_2O_5$, $La_2O_3$, $Y_2O_3$, other suitable high-k dielectric material, or combinations thereof. The gate electrode includes an electrically conductive material. In some implementations, the gate electrode includes multiple layers, such as one or more capping layers, work function layers, glue/barrier layers, and/or metal fill (or bulk) layers. A capping layer can include a material that prevents or eliminates diffusion and/or reaction of constituents between the gate dielectric and other layers of the gate electrode. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

Metal gate stacks 22A-22C are fabricated according to a gate last process, a gate first process, or a hybrid gate last/gate first process. In gate last process implementations, gate structures 20A-20C include dummy gate stacks that are subsequently replaced with metal gate stacks 22A-22C. The dummy gate stacks include, for example, an interfacial layer (including, for example, silicon oxide) and a dummy gate electrode layer (including, for example, polysilicon). In such implementations, the dummy gate electrode layer is removed, thereby forming openings (trenches) in which metal gate stacks 22A-22C are formed. In some implementations, the dummy gate stacks are formed before forming an interlayer dielectric layer, and the dummy gate stacks are replaced with metal gate stacks 22A-22C after forming the interlayer dielectric layer. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof.

Gate structures 20A-20C further include spacers 26A-26C, which are disposed adjacent to (for example, along sidewalls of) metal gate stacks 22A-22C, respectively. Spacers 26A-26C are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 12 and subsequently anisotropically etched to form spacers 26A-26C. In some implementations, spacers 26A-26C include a multilayer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to metal gate stacks 22A-22C. In such implementations, the various sets of spacers can include materials having different etch rates. For example, a first dielectric layer including silicon and oxygen (for example, silicon oxide) can be deposited over substrate 12 and subsequently anisotropically etched to form a first spacer set adjacent to metal gate stacks 22A-22C (or dummy metal gate stacks, in some implementations), and a second dielectric layer including silicon and nitrogen (for example, silicon nitride) can be deposited over substrate 12 and subsequently anisotropically etched to form a second spacer set adjacent to the first spacer set. Implantation, diffusion, and/or annealing processes can be performed to form lightly doped source and drain (LDD) features and/or heavily doped source and drain (HDD) features in substrate 12 before and/or after forming spacers 26A-26C.

Epitaxial source features and epitaxial drain features (referred to as epitaxial source/drain features) are disposed in source/drain regions of substrate 12. For example, a semiconductor material is epitaxially grown on substrate 12, forming epitaxial source/drain features 30 over a source region and a drain region of substrate 12. In the depicted embodiment, gate structure 20B interposes epitaxial source/drain features 30, and a channel region is defined between epitaxial source/drain features 30. Gate structure 20B and epitaxial source/drain features 30 thus form a portion of a transistor of IC device 10. Gate structure 20B and/or epitaxial source/drain features 30 are thus alternatively referred to as device features. In some implementations, epitaxial source/drain features 30 wrap source/drain regions of a fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 12. Epitaxial source/drain features 30 are doped with n-type dopants and/or p-type dopants. In some implementations, where the transistor is configured as an n-type device (for example, having an n-channel), epitaxial source/drain features 30 can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device (for example, having a p-channel), epitaxial source/drain features 30 can be silicon-and-germanium-containing epitaxial layers doped with boron, other p-type dopant, or combinations thereof (for example, forming Si:Ge:B epitaxial layers). In some implementations, epitaxial source/drain features 30 include materials and/or dopants that achieve desired tensile stress and/or compressive stress in the channel region. In some implementations, epitaxial source/drain features 30 are doped during deposition by adding impurities to a source material of the epitaxy process. In some implementations, epitaxial source/drain features 30 are doped by an ion implantation process subsequent to a deposition process. In some implementations, annealing processes are performed to activate dopants in epitaxial source/drain features 30 and/or other source/drain regions of IC device 10 (for example, HDD regions and/or LDD regions).

In some implementations, silicide layers are formed on epitaxial source/drain features 30. In some implementations, silicide layers are formed by depositing a metal layer over epitaxial source/drain features 30. The metal layer includes any material suitable for promoting silicide formation, such as nickel, platinum, palladium, vanadium, titanium, cobalt, tantalum, ytterbium, zirconium, other suitable metal, or combinations thereof. IC device 10 is then heated (for example, subjected to an annealing process) to cause constituents of epitaxial source/drain features 30 (for example, silicon and/or germanium) to react with the metal. The silicide layers thus include metal and a constituent of epitaxial source/drain features 30 (for example, silicon and/or germanium). In some implementations, the silicide layers include nickel silicide, titanium silicide, or cobalt silicide. Any un-reacted metal, such as remaining portions of the metal layer, is selectively removed by any suitable process, such as an etching process. In some implementations, the silicide layers and epitaxial source/drain features 30 are collectively referred to as the epitaxial source/drain features of IC device 10.

A multilayer interconnect (MLI) feature 40 is disposed over substrate 12. MLI feature 40 electrically couples various devices (for example, transistors, resistors, capacitors, and/or inductors) and/or components (for example, gate structures and/or source/drain features) of IC device 10, such that the various devices and/or components can operate as specified by design requirements of IC device 10. MLI feature 40 includes a combination of dielectric layers and electrically conductive layers (for example, metal layers) configured to form various interconnect structures. The conductive layers are configured to form vertical interconnect features (providing, for example, vertical connection between features and/or vertical electrical routing), such as contacts and/or vias, and/or horizontal interconnect features (providing, for example, horizontal electrical routing), such as conductive lines. Vertical interconnect features typically connect horizontal interconnect features in different layers (or different planes) of MLI feature 40. During operation, the interconnect features are configured to route signals between the devices and/or the components of IC device 10 and/or distribute signals (for example, clock signals, voltage signals, and/or ground signals) to the devices and/or the components of IC device 10. Though MLI feature 40 is depicted with a given number of dielectric layers and conductive layers, the present disclosure contemplates MLI feature 40 having more or less dielectric layers and/or conductive layers.

In FIG. 1, MLI feature 40 includes one or more dielectric layers, such as an interlayer dielectric layer 42 (ILD-0) disposed over substrate 12, an interlayer dielectric layer 44 (ILD-1) disposed over ILD layer 42, an interlayer dielectric layer 46 (ILD-2) disposed over ILD layer 44, and an interlayer dielectric layer 48 (ILD-3) disposed over ILD layer 46. ILD layers 42-48 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In the depicted embodiment, ILD layers 42-48 are dielectric layers that include a low-k dielectric material (generally referred to as low-k dielectric layers). ILD layers 42-48 can include a multilayer structure having multiple dielectric materials. MLI feature 40 can further include one or more contact etch stop layers (CESL) disposed over substrate 12, such as a CESL 52 disposed between ILD layer 42 and ILD layer 44, a CESL 54 disposed between ILD layer 44 and ILD layer 46, and a CESL 56 disposed between ILD layer 46 and ILD layer 48. In some implementations, a CESL (not shown) is also disposed between substrate 12 and ILD layer 42. CESLs 52-56 include a material different than ILD layers 42-48, such as a dielectric material that is different than the dielectric material of ILD layers 42-48. In the depicted embodiment, where ILD layers 42-48 include a low-k dielectric material, CESLs 52-56 include silicon and nitrogen, such as silicon nitride or silicon oxynitride. ILD layers 42-48 and/or CESLs 52-56 are formed over substrate 12, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layers 42-48 and/or CESLs 52-56 are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of ILD layers 42-48 and/or CESLs 52-56, a CMP process and/or other planarization process is performed, such that ILD layers 42-48 and/or CESLs 52-56 have substantially planar surfaces for enhancing formation of overlying layers.

A device-level contact 60, a device-level contact 62, a device-level contact 64, a via 70, a via 72, a via 74, a conductive line 80, a conductive line 82, and a conductive line 84 are disposed in ILD layers 42-48 to form interconnect structures. Device-level contacts 60-64 (also referred to as local interconnects or local contacts) electrically couple and/or physically couple IC device features to other conductive features of MLI feature 40. For example, device-level contact 60 is a metal-to-poly (MP) contact, which generally refers to a contact to a gate structure, such as a poly gate structure or a metal gate structure. In the depicted embodiment, device-level contact 60 is disposed on gate structure 20B (in particular, metal gate stack 22B), such that device-level contact 60 connects gate structure 20B to via 70. Device-level contact 60 extends through ILD layer 44 and CESL 52, though the present disclosure contemplates embodiments where device-level contact 60 extends through more than one ILD layer and/or CESL of MLI feature 40. In furtherance of the example, device-level contact 62 and device-level contact 64 are metal-to-device (MD) contacts, which generally refer to contacts to a conductive region of IC device 10, such as source/drain regions. In the depicted embodiment, device-level contact 62 and device-level contact 64 are disposed on respective epitaxial source/drain features 30, such that device-level contact 62 and device-level contact 64 connect epitaxial source/drain features 30 respectively to via 72 and via 74. Device-level contact 62 and device-level contact 64 extend through ILD layer 42, ILD layer 44, and CESL 52, though the present disclosure contemplates embodiments where device-level contact 62 and/or device-level contact 64 extend through more than one ILD layer and/or CESL of MLI feature 40. In some implementations, device-level contacts 60-64 are MEOL conductive features that interconnect FEOL conductive features (for example, gate structures 20A-20C and/or epitaxial source/drain features 30) to BEOL conductive features (for example, vias 70-74), thereby electrically and/or physically coupling FEOL conductive features to BEOL conductive features.

Vias 70-74 electrically couple and/or physically couple conductive features of MLI feature 40 to one another. For example, via 70 is disposed on device-level contact 60, such that via 70 connects device-level contact 60 to conductive line 80; via 72 is disposed on device-level contact 62, such that via 72 connects device-level contact 62 to conductive line 82; and via 74 is disposed on device-level contact 64, such that via 74 connects device-level contact 64 to conductive line 84. In the depicted embodiment, vias 70-74 extend through ILD layer 46 and CESL 54, though the present disclosure contemplates embodiments where vias 70-74 extend through more than one ILD layer and/or CESL of MLI feature 40. In some implementations, vias 70-74 are BEOL conductive features that interconnect MEOL conductive features (for example, device-level contacts 60-64) to BEOL conductive features (for example, conductive lines 80-84), thereby electrically and/or physically coupling MEOL conductive features to BEOL conductive features. In some implementations, MLI feature 40 further includes vias that are BEOL conductive features that interconnect BEOL conductive features in different ILD layers to one another, such as conductive lines 80-84 to conductive lines (not shown) disposed in other ILD layers (not shown) overlying ILD layers 42-48, thereby electrically and/or physically coupling BEOL conductive features of IC device 10.

Device-level contacts 60-64, vias 70-74, and conductive lines 80-84 include any suitable conductive material, such as Ta, Ti, Al, Cu, Co, TaN, TiN, and/or other suitable conductive materials. Device-level contacts 60-64, vias 70-74, and conductive lines 80-84 are formed by patterning ILD layers 42-48 and/or CESLs 52-56. Patterning ILD layers 42-48 and CESLs 52-56 can include lithography processes and/or etching processes to form openings (trenches), such as contact openings and/or line openings in respective ILD layers 42-48 and/or CESLs 52-56. In some implementations, the lithography processes include forming a resist layer over respective ILD layers 42-48 and/or CESLs 52-56, exposing the resist layer to pattern radiation, and developing the exposed resist layer, thereby forming a patterned resist layer that can be used as a masking element for etching opening(s) in respective ILD layers 42-48 and/or CESLs 52-56. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layers 42-48, CESLs 52-56, device-level contacts 60-64, vias 70-74, and/or conductive lines 80-84.

Figure 2:
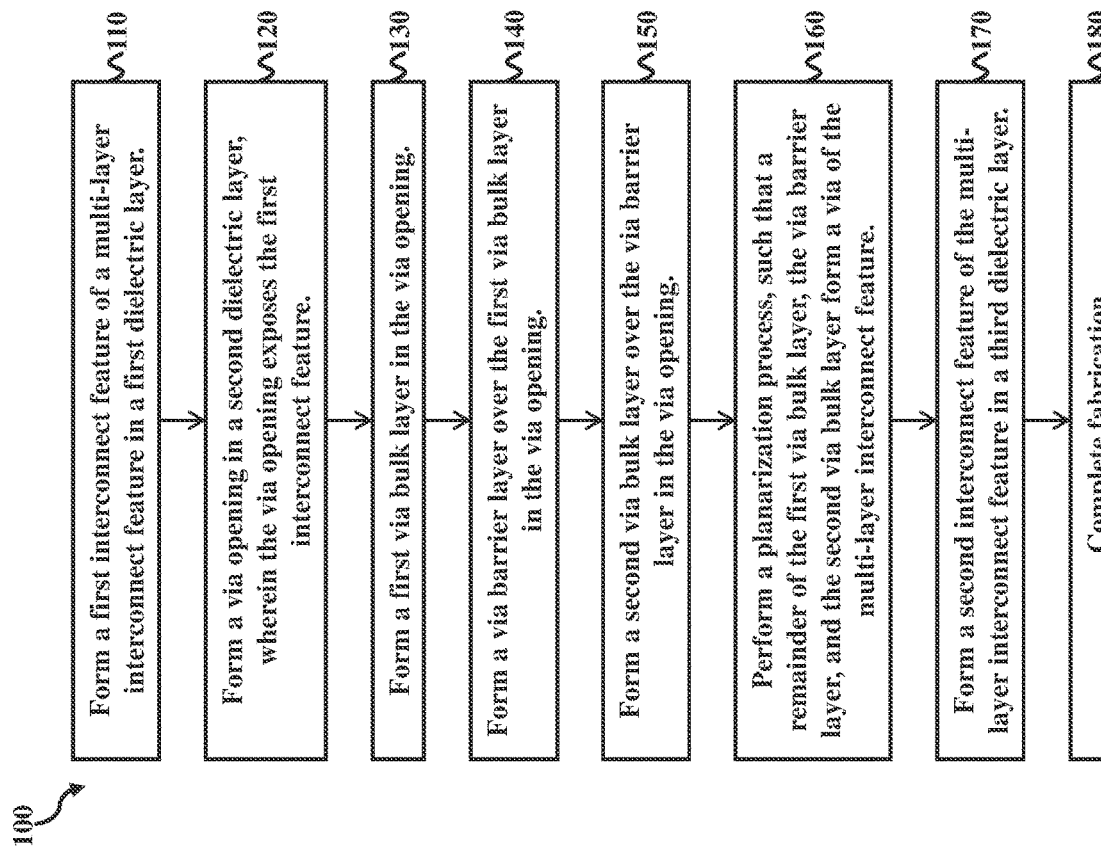
FIG. 2 is a flow chart of a method for fabricating an interconnect structure of a multi-layer interconnect feature according to various aspects of the present disclosure.

FIG. 2 is a flow chart of a method 100 for fabricating an interconnect structure of an MLI feature according to various aspects of the present disclosure. FIGS. 3A-3G are enlarged fragmentary diagrammatic views of a portion A of IC device 10, in portion or entirety, when implementing method 100 of FIG. 2 to fabricate the interconnect structure of the MLI feature according to various aspects of the present disclosure. The interconnect structure of FIG. 2 and FIGS. 3A-3G includes a via, such as via 72, configured to protect underlying conductive features of the MLI feature, such as underlying MEOL features and/or underlying BEOL features, from damage during subsequent processing, as described herein. FIG. 2 and FIGS. 3A-3G have been simplified for the sake of clarity to better understand the inventive concepts of the present disclosure. Additional steps can be provided before, during, and after method 100, and some of the steps described can be moved, replaced, or eliminated for additional embodiments of method 100. Additional features can be added in the interconnect structure depicted in portion A, and some of the features described below can be replaced, modified, or eliminated in other embodiments of the interconnect structure depicted in portion A.

At block 110, a first interconnect feature of an MLI feature is formed in a first dielectric layer. In some implementations, the first interconnect feature is a MEOL feature, such as a device-level contact of the MLI feature (for example, one of device-level contacts 60-64). Alternatively, in some implementations, the first interconnect feature is a BEOL feature, such as a conductive line of the MLI feature (for example, one of conductive lines 80-84). The first interconnect feature includes cobalt. For example, turning to FIG. 3A, device-level contact 62 is formed in ILD layer 44. Device-level contact 62 includes cobalt. In some implementations, a volume of device-level contact 62 includes at least 20% cobalt. For example, device-level contact 62 includes cobalt or cobalt alloy (for example, including titanium, tungsten, nickel, phosphorous, boron, aluminum, tantalum, other suitable cobalt alloying constituent, or combinations thereof). In some implementations, forming device-level contact 62 includes performing a lithography and etching process to form a contact opening in ILD layer 44 (which further extends into CESL 52 and ILD layer 42 (not shown)), filling the contact opening with a cobalt-containing material, and performing a planarization process that removes excess cobalt-containing material, such that the cobalt-containing material and the ILD layer 44 have substantially planar surfaces. The contact opening has sidewalls defined by ILD layer 44 (along with CESL 52 and ILD layer 42) and a bottom defined by an IC feature, such as epitaxial source/drain feature 30 (not shown). The cobalt-containing material is formed by a deposition process (for example, PVD, CVD, ALD, or other suitable deposition process) and/or annealing process. In some implementations, a cobalt precursor used during the deposition process is cyclopentadienyl cobalt dicarbonyl ($CpCo(CO)_2$), dicobalt hexcarbonyl tertbutylacctylene (CCTBA), cobalt tricarbonyl nitrosyl ($Co(CO)_3NO$), bis(cyclopentadienyl)cobalt ($Co(C_5H_5)_2$, $CpCo(CO)_2$), bis(ethylcyclopentadienyl)cobalt ($C_{14}H_{18}Co$), bis(pentamethylcyclopentadienyl)cobalt ($C_{20}H_{30}Co$), cobalt tris(2,2,6,6-tetramethyl-3,5-heptanedionate) ($Co(OCC(CH_3)_3CHCOC(CH_3)_3)_3$), bis(ethylcyclopentadienyl)cobalt ($C_{14}H_{18}Co$), other suitable cobalt precursor, or combinations thereof. In some implementations, device-level contact 62 includes a bulk layer (also referred to as a device-level plug) that consists essentially of cobalt or cobalt alloy. In some implementations, device-level contact 62 includes a barrier layer, an adhesion layer, and/or other suitable layer disposed between the bulk layer and ILD layer 44 (along with CESL 52 and ILD layer 42). In such implementations, the barrier layer and/or the adhesion layer conform to the contact opening, such that the barrier layer and/or the adhesion layer are disposed on ILD layer 44 (along with CESL 52, ILD layer 42, and epitaxial source/drain feature 30) and the bulk layer is disposed on the barrier layer and/or the adhesion layer. In some implementations, the barrier layer, the adhesion layer, and/or other suitable layer include titanium, titanium alloy (for example, TiN), tantalum, tantalum alloy (for example, TaN), other suitable constituent, or combinations thereof.

At block 120, a via opening is formed in a second dielectric layer, wherein the via opening exposes the first interconnect feature. For example, turning to FIG. 3B, a via opening 122 is formed in ILD layer 46 (and, in some implementations, CESL 54) by a patterning process to expose device-level contact 62. In the depicted embodiment, via opening 122 extends vertically through ILD 46 and CESL 54. Via opening 122 includes a sidewall 124 (defined by ILD 46 and CESL 54), a sidewall 126 (defined by ILD 46 and CESL 54), and a bottom 128 (defined by device-level contact 62) that extends between sidewall 124 and sidewall 126. In some implementations, a depth D of via opening 122 is about 10 nm to about 50 nm. In some implementations, forming via opening 122 includes forming a dielectric layer over device-level contact 62 and ILD layer 44 (here, ILD layer 46) and patterning the dielectric layer to include an opening that exposes device-level contact 62, such as a top surface 129 of device-level contact 62. In some implementations, a CVD process is performed to deposit a low-k dielectric material over device-level contact 62 and ILD layer 44, thereby forming ILD layer 46. CESL 54 can be formed over ILD 44 before forming ILD layer 46, though the present disclosure contemplates embodiments that omit CESL 54. CESL 54 includes a material having a different etching characteristic than a material of ILD layer 46, such as silicon nitride. ILD layer 46 (and CESL 54) can be patterned by lithography processes and/or etching processes. For example, forming via opening 122 includes performing a lithography process to form a patterned resist layer (not shown) over ILD layer 46 and performing an etching process to transfer a pattern defined in the patterned resist layer to ILD layer 46. The lithography process can include forming a resist layer on ILD layer 46 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of ILD layer 46 and CESL 54, thereby exposing device-level contact 62 (for example, a bulk layer of device-level contact 62 that includes cobalt). In some implementations, ILD layer 46 is used as etching mask when removing portions of CESL 54. The etching process can include a dry etching process (for example, a reactive ion etching (RIE) process), a wet etching process, other suitable etching process, or combinations thereof. In some implementations, various selective etching processes are performed to form via opening 122. After the etching process, the patterned resist layer is removed from ILD layer 46, for example, by a resist stripping process. Alternatively, the exposure process can be implemented or replaced by other methods, such as maskless lithography, electron-beam writing, ion-beam writing, and/or nanoimprint technology.

At block 130, a first via bulk layer (also referred to as a first via plug) is formed in the via opening. For example, turning to FIG. 3C, a via bulk layer 132 is formed in via opening 122. Via bulk layer 132 partially fills via opening 122, such that via bulk layer 132 has a thickness T1 that is less than depth D. In some implementations, thickness T1 is less than about 50 nm (for example, about 5 nm to about 49 nm). In the depicted embodiment, via bulk layer 132 is disposed directly on exposed top surface 129 of device-level contact 62 and a portion of sidewalls 124, 126 defined by ILD layer 46 and CESL 54. A remaining (unfilled) portion of via opening 122 has a depth D', which is defined between a top surface of ILD layer 46 and a top surface 134 of via bulk layer 132. In some implementations, depth D' is about 1 nm to about 45 nm. In the depicted embodiment, via bulk layer 132 includes tungsten, tungsten alloy, ruthenium, ruthenium alloy, cobalt, or cobalt alloy. In some implementations, via bulk layer 132 includes tungsten, ruthenium, cobalt, copper, aluminum, iridium, palladium, platinum, nickel, other low resistivity metal constituent, alloys thereof, or combinations thereof. In some implementations, a material of via bulk layer 132, such as copper, may necessitate a liner layer configured to prevent metal constituents of via bulk layer 132 from diffusing into ILD layer 46. Via bulk layer 132 is formed by a bottom-up deposition process, which generally refers to a deposition process that fills an opening from bottom to top (which can be referred to as bottom-up fill of the opening). In some implementations, the bottom-up deposition process includes configuring the various parameters of the deposition process to selectively grow via bulk material from metal surfaces (here, bottom 128 of via opening 122 defined by exposed top surface 129 of device-level contact 62) while limiting (or preventing) growth of the via bulk material from dielectric surfaces (here, sidewalls 124, 126 defined by ILD layer 46 and CESL 54 and a top surface of ILD layer 46). Such can be referred to as a selective deposition process. For example, forming via bulk layer 132 includes tuning various parameters of a deposition process, such as a CVD process, to selectively grow tungsten, ruthenium, or cobalt, from exposed top surface 129 of device-level contact 62 while limiting (or preventing) growth of the tungsten, ruthenium, or cobalt from ILD layer 46 and/or CESL 54. The various deposition parameters that can be tuned include deposition precursors (for example, metal precursors and/or reactants), deposition precursor flow rates, deposition temperature, deposition time, deposition pressure, source power, radio frequency (RF) bias voltage, RF bias power, other suitable deposition parameters, or combinations thereof. In another example, forming via bulk layer 132 includes performing an ALD-cyclic process, where a number of ALD cycles is tuned to control thickness T1 of via bulk layer 132, such as a ruthenium layer. The deposition process is PVD, CVD, ALD, electroplating, electroless plating, other suitable deposition process, or combinations thereof. Thickness T1 and depth D can be tuned to achieve a ratio of thickness T1 to depth D that enhances the bottom-up deposition process. For example, in some implementations, a ratio of thickness T1 to depth D (T1/D) is about 1 to about 20. Alternatively, in some implementations, via bulk layer 132 is formed by depositing a via bulk material that completely fills via opening 122 (not necessarily in a bottom-up fashion) and etching back the via bulk material until achieving a desired thickness (for example, thickness T1) of via bulk layer 132 and/or a desired depth of the remaining (unfilled) portion of via opening 122 (for example, depth D'). In some implementations, the etching back can remove any via bulk material deposited over the top surface of ILD layer 46. The depositing and etching back can be implemented by any suitable process, such as those described herein.

At block 140, a via barrier layer (also referred to as a via liner layer) is formed over the via bulk layer in the via opening. For example, turning to FIG. 3D, a via barrier layer 142 is formed in via opening 122. Via barrier layer 142 partially fills via opening 122. In the depicted embodiment, via barrier layer 142 is disposed directly on portions of via bulk layer 132 and ILD layer 46 that define the remaining (unfilled) portion of via opening 122 (here, top surface 134 of via bulk layer 132 and remaining portions of sidewalls 124, 126 defined by ILD layer 46). As deposited, via barrier layer 142 exhibits an omega shape and does not physically contact device-level contact 62 (in contrast to conventional via barrier layers), such that via barrier layer 142 "floats" within via opening 122. Via barrier layer 142 is thus referred to as a "floating" omega-shaped via barrier layer. Depth D' of the remaining (unfilled) portion of via opening 122 is reduced to a depth D'', which is defined between a top surface 144 of via barrier layer 142 and the top surface of ILD layer 46. In some implementations, depth D'' is about 1 nm to about 10 nm. Via barrier layer 142 is conformally deposited by PVD, CVD, ALD, electroplating, electroless plating, other suitable deposition process, or combinations thereof, such that via barrier layer 142 has a thickness T2 that is substantially uniform over exposed surfaces of the interconnect structure. In the depicted embodiment, thickness T2 is less than depth D', and a sum of thickness T1 and thickness T2 is less than depth D. In some implementations, thickness T2 is about 1 nm to about 10 nm. Via barrier layer 142 includes a material that promotes adhesion between a dielectric material (here, ILD layer 46) and a subsequently formed metal material for filling via opening 122. For example, via barrier layer 142 includes titanium, titanium alloy, tantalum, tantalum alloy, cobalt, cobalt alloy, ruthenium, ruthenium alloy, molybdenum, molybdenum alloy, other suitable constituent configured to promote and/or enhance adhesion between a metal material and a dielectric material, or combinations thereof. In the depicted embodiment, via barrier layer 142 includes tantalum and nitrogen (for example, tantalum nitride) or titanium and nitrogen (for example, titanium nitride). In some implementations, via barrier layer 142 includes more than is a via barrier multi-layer. For example, via barrier layer 142 includes a first sub-layer that includes titanium and a second sub-layer that includes titanium nitride. In another example, via barrier layer 142 includes a first sub-layer that includes tantalum and a second sub-layer that includes tantalum nitride.

At block 150, a second via bulk layer (also referred to as a second via plug) is formed over the via barrier layer in the via opening. For example, turning to FIG. 3E, a via bulk layer 152 is formed in via opening 122, such that via bulk layer 152 fills any remaining (unfilled) portion of via opening 122. In the depicted embodiment, via bulk layer 152 is disposed directly on top surface 144 of via barrier layer 142. In the depicted embodiment, via bulk layer 152 includes tungsten, tungsten alloy, ruthenium, ruthenium alloy, cobalt, or cobalt alloy. In some implementations, via bulk layer 152 includes tungsten, ruthenium, cobalt, copper, aluminum, iridium, palladium, platinum, nickel, other low resistivity metal constituent, alloys thereof, or combinations thereof. In some implementations, a metal material of via bulk layer 152 is the same as a metal material. In some implementations, a metal material of via bulk layer 152 is different than a metal material. Via bulk layer 152 is formed by a non-selective deposition process. For example, a blanket deposition process, such as CVD, is performed to deposit via bulk material over via barrier layer 142, thereby forming via bulk layer 152. In some implementations, the blanket deposition process is PVD, ALD, electroplating, electroless plating, other suitable deposition process, or combinations thereof.

At block 160, a planarization process is performed, such that a remainder of the first via bulk layer, the via barrier layer, and the second via bulk layer form a via (an interconnect feature) of the MLI feature. For example, turning to FIG. 3F, a CMP process and/or other planarization process is performed to remove excess via bulk layer 152 and/or via barrier layer 142 (such as that disposed over the top surface of ILD layer 46), resulting in a via 72. Via 72 includes via bulk layer 132, via barrier layer 142, and via bulk layer 152 having a thickness T3 (which combine to fill via opening 122). In some implementations, thickness T3 is about equal to $D^{1'}$ and less than thickness T1. For example, in some implementations, thickness T3 is about 1 nm to about 10 nm. The CMP process can planarize a top surface of via 72, such that a top surface of ILD layer 46 and a top surface of via 72 are substantially planar surfaces. Forming floating, omega-shaped via barrier layer 142 over via bulk layer 132 (FIG. 3E) improves adhesion between an upper portion of via 72 and ILD layer 46 (and/or a CESL), significantly reducing (and, in some implementations, eliminating) any gaps between via 72 and ILD layer 46. Slurry from the planarization process is thus prevented from seeping to underlying device-level contact 62, preventing or reducing corrosion (damage) of underlying device-level contact 62 during the planarization process and/or other subsequent processing. The enhanced adhesion provided between the upper portion of via 72 and ILD layer by floating, omega-shaped via barrier layer 142 can further prevent planarization-induced peeling.

Figure 3B:
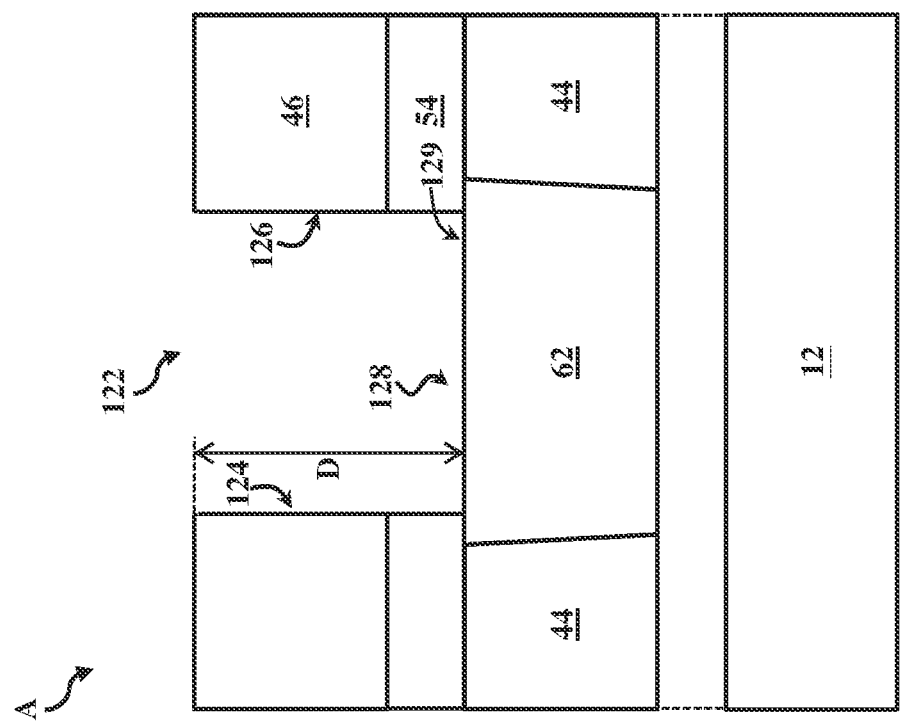
Figure 3A:
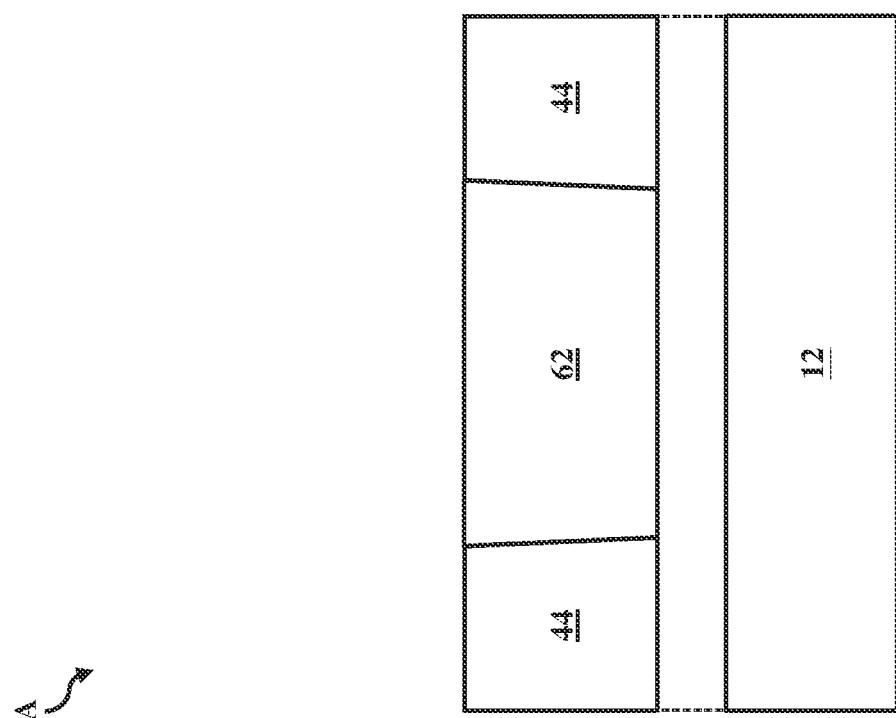
Figure 3D:
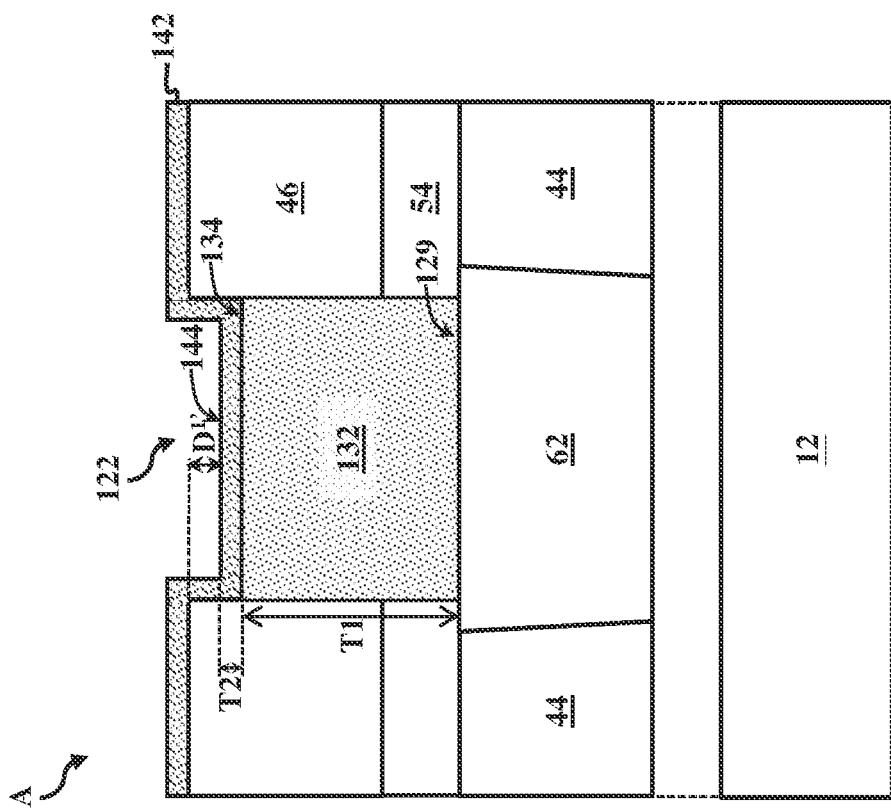
Figure 3C:
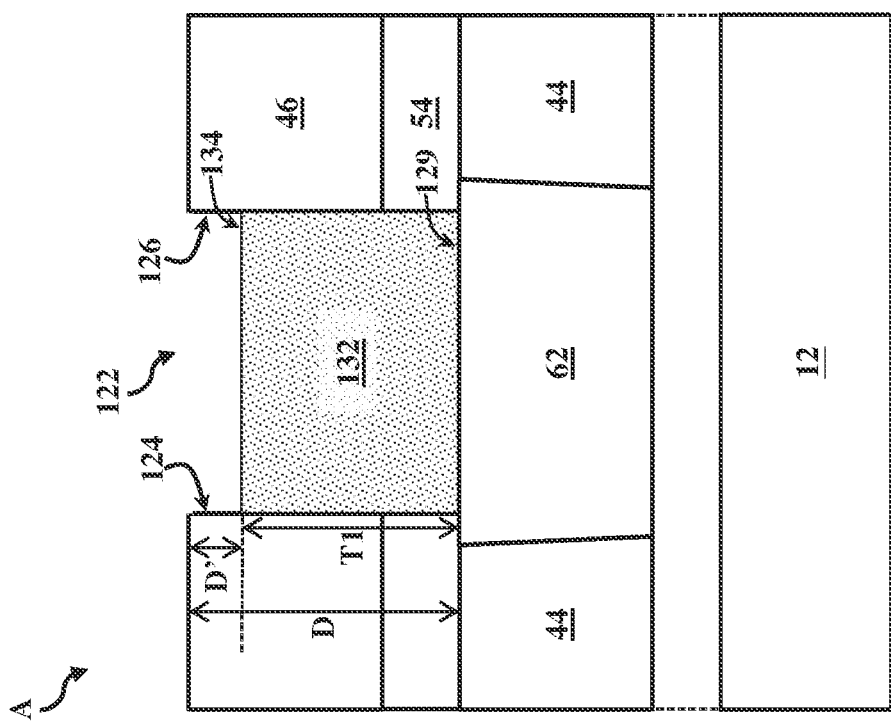
Figure 3F:
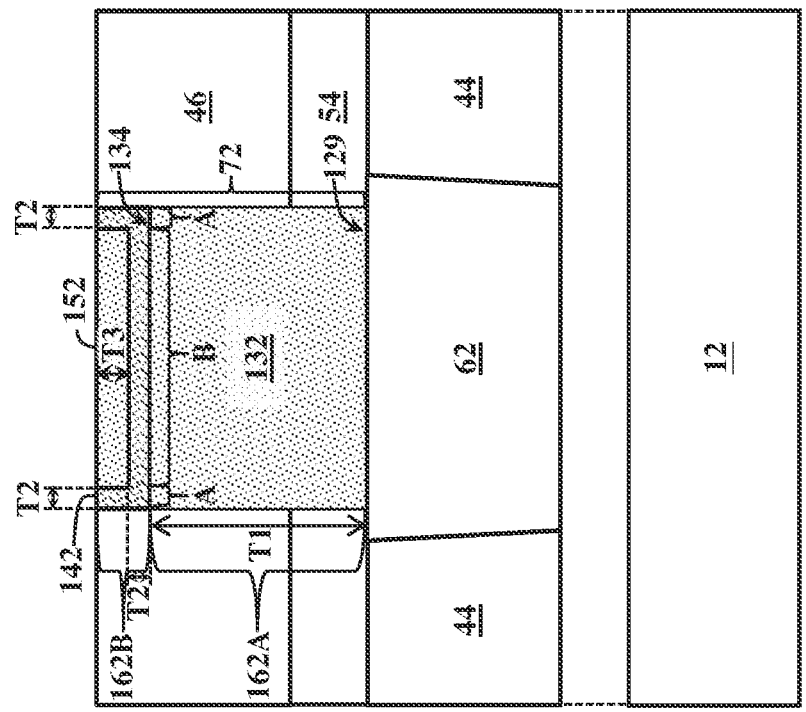
Figure 3E:
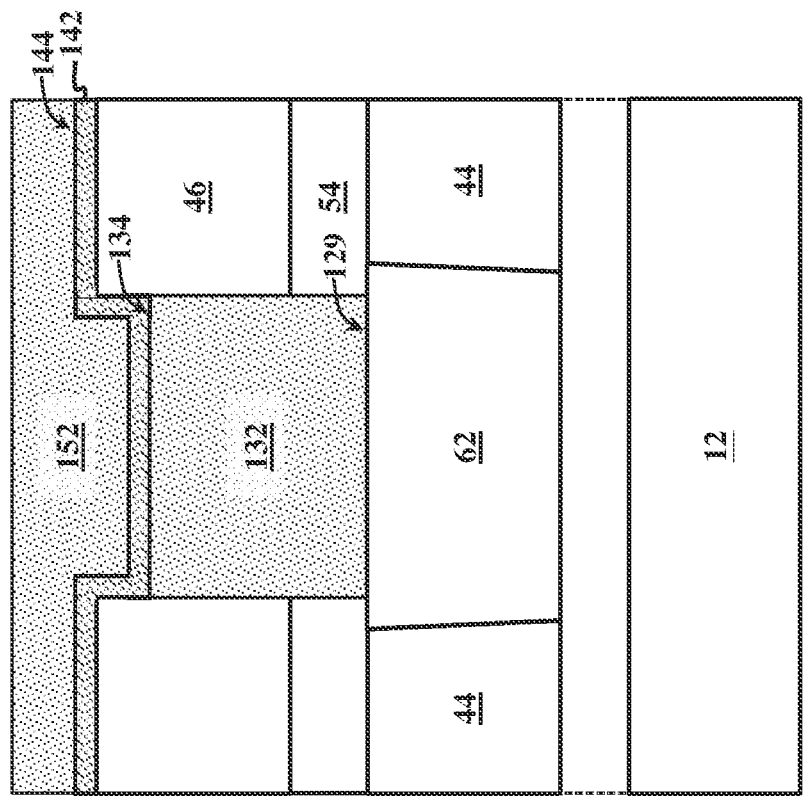

Via bulk layer 132 and via bulk layer 152 can collectively be referred to as a via plug, where via bulk layer 132 is a first via plug portion and via bulk layer 152 is a second via plug portion. In the depicted embodiment, via 72 has a barrier-free via portion 162A, where no barrier layer exists between the via plug (here, via bulk layer 132) and an ILD layer and/or a CESL (here, ILD layer 46 and CESL 54), and a barrier via portion 162B, where a barrier layer (here, via barrier layer 142) is disposed between the via plug (here, via bulk layer 152) and the ILD layer and/or the CESL (here, ILD layer 46). Via barrier layer 142 thus only partially lines sidewalls of via 72. In FIG. 3F, via barrier layer 142 lines a bottom surface of via bulk layer 152, sidewalls of via bulk layer 152, and a top surface of via bulk layer 132, but does not line a bottom surface or sidewalls of via bulk layer 132. Since via bulk layer 132 is disposed between via barrier layer 142 and device-level contact 62, via barrier layer 142 floats within via 72 and does not physically contact device-level contact 62. Accordingly, a volume of the via plug, such as via bulk layer 132 and/or via bulk layer 152, is maintained sufficiently high and via barrier layer 142 has minimal impact on a resistance of via 72, such that via 72 exhibits low resistance, and in some implementations, exhibits resistances similar to that of barrier-free vias. In some implementations, via barrier layer 142 constitutes less than about 2% of a volume of via 72, via bulk layer 152 constitutes about 1% to about 10% of the volume of via 72, and via bulk layer 132 constitutes about 90% to about 99% of the volume of via 72. In some implementations, to maximize via plug volume, via barrier layer 142 is disposed in a topmost portion of via 72 having a thickness of about 1 nm to about 10 nm.

In furtherance of the depicted embodiment, via bulk layer 142 has portions A and a portion B disposed between portions A, where portions A and portion B combine to form a substantially U-shaped via bulk layer 142. Portions A line ILD layer 46 and portion B lines top surface 134 of via bulk layer 132. Portions A have thickness T2 and portion B has thickness T2, such that via bulk layer 132 has a substantially uniform thickness in via 72. Top surface of portion B is lower than top surfaces of portions A. In the depicted embodiment, top surfaces of portions A and portion B of via bulk layer 142 are substantially planar. Sidewalls of via bulk layer 152 are lined by portions A of via barrier layer 142 and the bottom of via bulk layer 152 is lined by portion B, such that via bulk layer 152 is partially surrounded by via barrier layer 142 on three sides. A width ($W_{152}$) of via bulk layer 152 is less than a width ($W_{132}$) of via bulk layer 132. In some implementations, a width of via bulk layer 152 is about equal to a width of via bulk layer 132 minus thickness T2 of portions A of via barrier layer 142 (in other words, $W_{152}=W_{132}-T2$). A thickness of via bulk layer 132 is greater than a thickness of via bulk layer 152 (in other words, T1>T3) and a thickness of via barrier layer 142 (in other words, T1>T2). In some implementations, a ratio of thickness T1 to thickness T2 (T1:T2) is about 5:1 to about 25:1. In some implementations, a thickness of via bulk layer 132 is greater than a sum of a thickness of via bulk layer 132 and a thickness of via barrier layer 142 (in other words, T1>T2+T3). In some implementations, a ratio of thickness T1 to a sum of thickness T2 and thickness T3 (T1:T2+T3) is about 2.5:1 to about 12.5:1. In the depicted embodiment, via bulk layer 132 has a rectangular-shaped cross-section. For example, via bulk layer 132 has a substantially planar bottom surface, a substantially planar top surface, and substantially planar sidewalls. In some implementations, sidewalls of via 72 are tapered, such that sidewalls of via bulk layer 132, via barrier layer 142, and/or via bulk layer 152 are tapered. Via bulk layer 132 may thus have a trapezoidal-shaped cross-section. In such implementations, thicknesses of via bulk layer 132 and/or via bulk layer 152 decrease from their top surfaces to their bottom surfaces.

At block 170, a second interconnect feature of the MLI feature is formed in a third dielectric layer. The second interconnect feature is a BEOL feature, such as a conductive line of the MLI feature (for example, one of conductive lines 80-84). For example, turning to FIG. 3G, conductive line 82 is formed in ILD layer 48. Conductive line 82 includes tungsten, ruthenium, cobalt, copper, aluminum, iridium, palladium, platinum, nickel, other low resistivity metal constituent, alloys thereof, or combinations thereof. In some implementations, forming conductive line 82 includes performing a lithography and etching process to form a contact opening in ILD layer 48 (which further extends into CESL 56), filling the contact opening with a conductive material, and performing a planarization process that removes excess conductive, such that the conductive and the ILD layer 48 have substantially planar surfaces. The contact opening has sidewalls defined by ILD layer 48 (along with CESL 56) and a bottom defined by via 72. The conductive material is formed by a deposition process (for example, PVD, CVD, ALD, or other suitable deposition process) and/or annealing process. In some implementations, conductive line 82 includes a bulk layer (also referred to as a conductive plug). In some implementations, conductive line 82 includes a barrier layer, an adhesion layer, and/or other suitable layer disposed between the bulk layer and ILD layer 48 (along with CESL 56). In such implementations, the barrier layer and/or the adhesion layer conform to the contact opening, such that the barrier layer and/or the adhesion layer are disposed on ILD layer 48 (along with CESL 56) and the bulk layer is disposed on the barrier layer and/or the adhesion layer. In some implementations, the barrier layer, the adhesion layer, and/or other suitable layer include titanium, titanium alloy (for example, TiN), tantalum, tantalum alloy (for example, TaN), other suitable constituent, or combinations thereof. In the depicted embodiment, conductive line 82 has a rectangular-shaped cross-section. For example, conductive line 82 has a substantially planar bottom surface, a substantially planar top surface, and substantially planar sidewalls. In some implementations, sidewalls of conductive line 82 are tapered, such that a thickness of conductive line 82 decreases from a top surface of ILD layer 48 to the top surface of ILD layer 46. In furtherance of the depicted embodiment, conductive line 82 physically contacts ILD layer 46, via barrier layer 142, and via bulk layer 152.

Device-level contact 62, via 72, and conductive line 82 combine to form an interconnect structure 172 of MLI feature 40. Via 72 extends vertically through ILD layer 46 and CESL 54 to physically and/or electrically couple interconnect features in different levels (or layers) of MLI feature 40—here, device-level contact 62 (disposed in a contact layer of MLI feature 140) and conductive line 82 (disposed in a metal-1 (M1) layer of MLI feature 40). At block 180, fabrication can continue to complete fabrication of the MLI feature, such as MLI feature 40. For example, additional levels of MLI feature 40 can be formed over the M1 layer, such as an M2 layer to an Mn layer, where n represents a number of metal layers in MLI feature 40 and each of M2 layer to Mn layer include conductive lines, similar to conductive lines 80-84 disposed in a dielectric material. Vias, similar to vias 70-74, can be fabricated to connect adjacent metal layers, such as M2 layer to Mn layer. In some implementations, one or more of the vias may connect non-adjacent metal layers.

Figure 5:
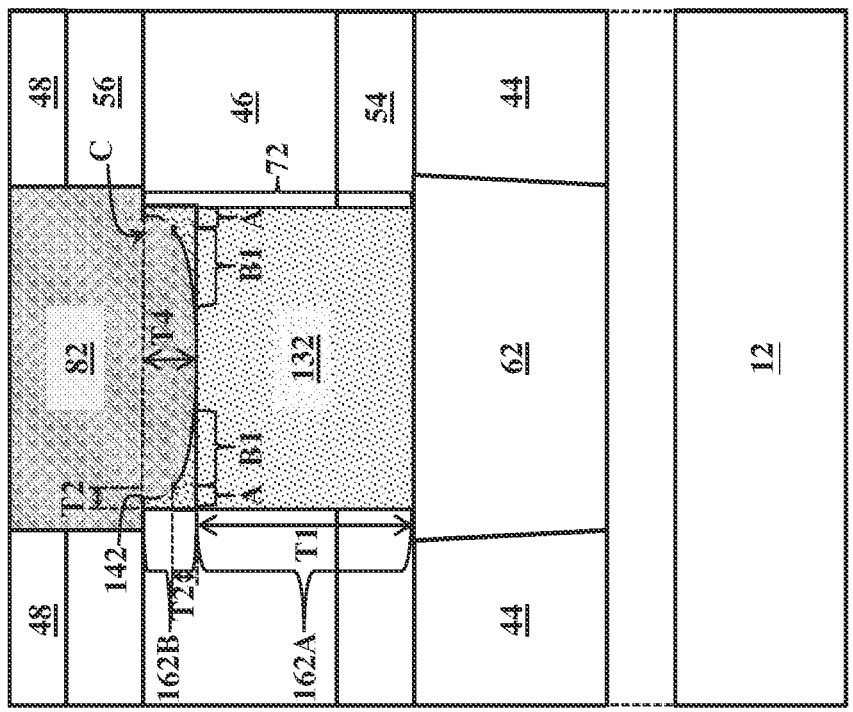
FIG. 4, FIG. 5, and FIG. 6 are enlarged fragmentary diagrammatic views of the portion A of different interconnect structures of the integrated circuit device of FIG. 1, in portion or entirety, that can arise when implementing the method of FIG. 2, according to various aspects of the present disclosure.
Figure 4:
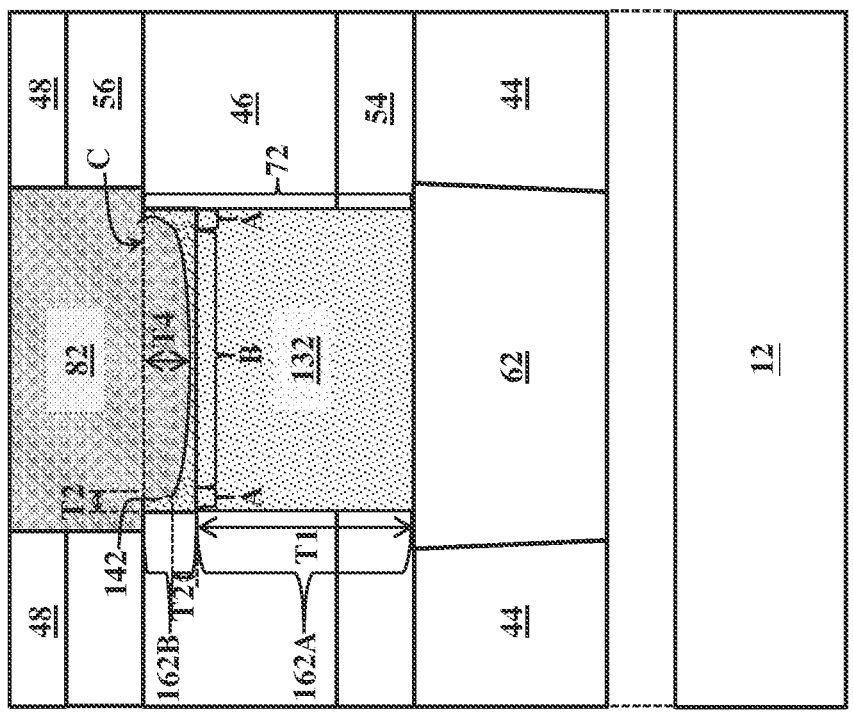
Figure 6:
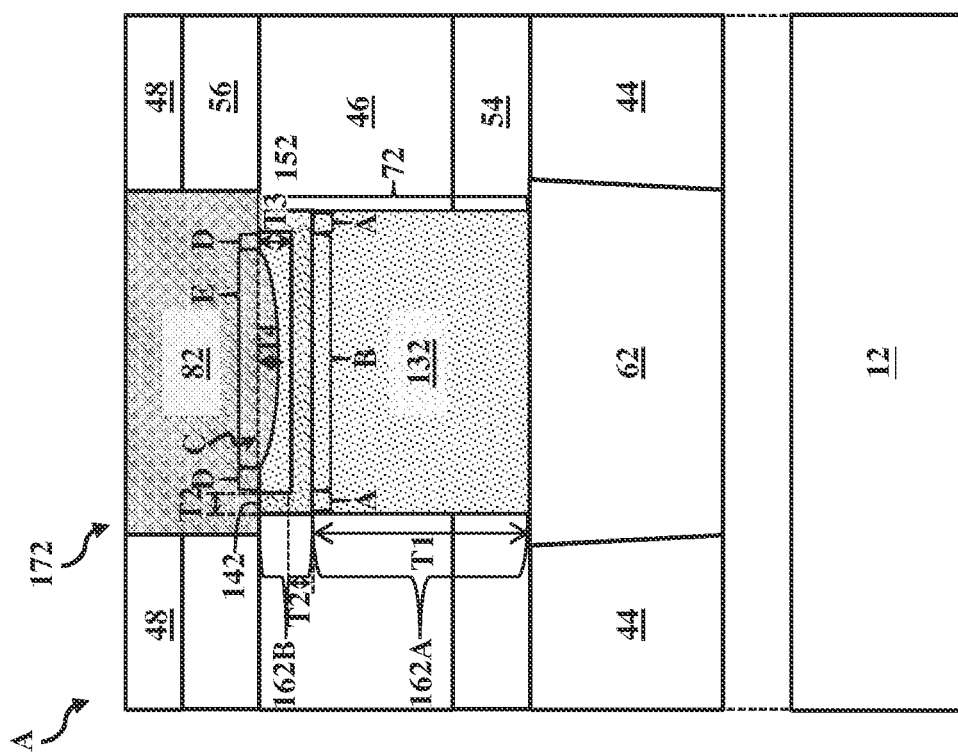

The present disclosure contemplates embodiments where via bulk layer 152 and/or via barrier layer 142 are partially or fully removed from via opening 122 by the planarization process. For example, parameters of the planarization process, such as the CMP process, can be configured to modify a profile of via barrier layer 142 and/or via bulk layer 152 as desired. In some implementations, the parameters of the planarization process are tuned to achieve desired top surface configurations and/or thickness configurations of via barrier layer 142 and/or via bulk layer 152. Turning to FIGS. 4-6, FIGS. 4-6 are enlarged fragmentary diagrammatic views of the portion A of IC device 10, in portion or entirety, according to various aspects of the present disclosure. In FIG. 4, the planarization process implemented in method 100 of FIG. 2 fully removes via bulk layer 152 and partially removes via barrier layer 142, such that via 72 does not include via bulk layer 152. The planarization process modifies a top surface of via barrier layer 142. For example, portion B of via barrier layer 142 has a concave top surface, such that a thickness of a center of portion B is less than a thickness of edges of portion B. In some implementations, a thickness of portion B decreases from thickness T2 at the edges of portion B to a thickness less than thickness T2 at the center of portion B. In some implementations, as depicted, portions A have tapered thicknesses. For example, a thickness of portions A increases from a thickness less than thickness T2 at top surfaces of portions A to thickness T2 at bottom surfaces of portions A. In some implementations, portions A have a substantially planar sidewall surface and a curved sidewall surface, and portion B has a curved top surface and a substantially planar bottom surface. In furtherance of the depicted embodiment, conductive line 82 includes a portion C that extends below the top surface of ILD layer 46 and physically contacts via barrier layer 142. Portion C has a thickness T4 that is less than a sum of thickness T3 and thickness T2 (in other words, T4<T3+T2). In some implementations, thickness T4 is less than about 10 nm. A concave bottom surface of portion C physically contacts via barrier layer 142, such that a thickness of a center of portion C is greater than a thickness of edges of portion C. For example, thickness T4 at the center of portion C is greater than thickness T4 at the edges of portion C. Conductive line 82 thus has a bottom surface that includes a concave bottom surface portion disposed between substantially planar bottom surface portions. Additional features can be added in the interconnect structure depicted in portion A of FIG. 4 and some of the features described can be replaced, modified, or eliminated in other embodiments of the interconnect structure depicted in portion A of FIG. 4.

In FIG. 5, the planarization process fully removes via bulk layer 152 and fully removes a portion of via barrier layer 142, such that via 72 does not include via bulk layer 152 and a portion of via barrier layer 142 is completely removed from over top surface 134 of via bulk layer 132. In such implementations, the planarization process modifies a top surface of via barrier layer 142 and separates portion B of via barrier layer 142 into portions B1, such that via barrier layer 142 is separated into two discrete portions, where each discrete portion includes one of portions A and one of portions B1. Portions B1 have curved top surfaces and substantially planar bottom surfaces. Thicknesses of portions B1 taper from thickness T2 (adjacent to portions A) to zero. In some implementations, as depicted, top portions of portions A have tapered thicknesses, and bottom portions of portions A have thickness T2. For example, a thickness of top portions of portions A increases from a thickness less than thickness T2 at top surfaces of portions A to thickness T2 at some point along a length of portions A. In some implementations, portions A have a substantially planar sidewall surface and a curved sidewall surface. In furtherance of the depicted embodiment, conductive line 82 also includes portion C that extends below the top surface of ILD layer 46, where portion C physically contacts not only via barrier layer 142 but also a portion of top surface 134 of via bulk layer 132. In such implementations, thickness T4 is less than or equal to a sum of thickness T3 and thickness T2 (in other words, T4≤T3+T2). In some implementations, thickness T4 is about 1 nm to about 10 nm. The concave bottom surface of portion C physically contacts via barrier layer 142 and via bulk layer 132, such that a thickness of the center of portion C is greater than the thickness of edges of portion C. For example, thickness T4 at the center of portion C is greater than thickness T4 at the edges of portion C. Conductive line 82 thus has a bottom surface that includes a concave bottom surface portion disposed between substantially planar bottom surface portions. Additional features can be added in the interconnect structure depicted in portion A of FIG. 5 and some of the features described can be replaced, modified, or eliminated in other embodiments of the interconnect structure depicted in portion A of FIG. 5.

In FIG. 6, the planarization process partially removes via bulk layer 152, such that via 72 still includes via bulk layer 152. The planarization process modifies a top surface of via bulk layer 152. For example, via bulk layer 152 has portions D and a portion E disposed between portions D, where top surface of portion E is lower than top surfaces of portions D and top surface of ILD layer 46. Portions D have substantially planar top surfaces, such that thicknesses of portions D are substantially equal to thickness T3. In some implementations, thicknesses of portions D may be less than thickness T3. In some implementations, portions D may have tapered thicknesses, similar to portions A of via barrier layer 142 depicted in FIG. 4 and FIG. 5. Portion E has a concave surface, such that a thickness of a center of portion E is less than a thickness of edges of portion E. In some implementations, a thickness of portion E decreases from thickness T3 at the edges of portion E to a thickness less than thickness T3 at the center of portion E. In some implementations, a thickness of portion E decreases from a thickness less than thickness T3 at the edges of portion E to another thickness that is less than thickness T3 at the center of portion E. In some implementations, the planarization process separates portion E of via bulk layer 152 into two discrete portions, similar to via barrier layer 142 depicted in FIG. 5. In some implementations, via bulk layer 152 does not include different portions, instead having a concave top surface that extends between portions A of via barrier layer 142. In furtherance of the depicted embodiment, conductive line 82 also includes portion C that extends below the top surface of ILD layer 46, except portion C physically contacts via bulk layer 152 and not via barrier layer 142. In such implementations, thickness T4 is less than or equal to thickness T3 (in other words, T4<T3). The concave bottom surface of portion C physically contacts via barrier layer 142 and via bulk layer 132, such that a thickness of the center of portion C is greater than the thickness of edges of portion C. For example, thickness T4 at the center of portion C is greater than thickness T4 at the edges of portion C. Conductive line 82 thus has a bottom surface that includes a concave bottom surface portion disposed between substantially planar bottom surface portions. Additional features can be added in the interconnect structure depicted in portion A of FIG. 6 and some of the features described can be replaced, modified, or eliminated in other embodiments of the interconnect structure depicted in portion A of FIG. 6.

The present disclosure provides for many different embodiments. Interconnect structures and corresponding techniques for forming the interconnect structures are disclosed herein. An exemplary interconnect structure includes a via disposed in a dielectric layer. The via is configured to electrically couple a first interconnect feature and a second interconnect feature. The via includes a via barrier layer that physically contacts the dielectric layer. The via further includes a via plug disposed between the via barrier layer and the first interconnect feature, such that the via plug physically contacts the first interconnect feature and the dielectric layer. In some implementations, the first interconnect feature is a middle-end-of-line conductive feature and the second interconnect feature is a back-end-of-line conductive feature. In some implementations, the first interconnect feature and the second interconnect feature are back-end-of-line conductive features. In some implementations, the via plug includes tungsten. In some implementations, the via plug includes ruthenium. In some implementations, the via plug includes cobalt. In some implementations, the via barrier layer includes titanium. In some implementations, the via barrier layer includes tantalum. In some implementations, the via plug is a first via plug portion, and the via further includes a second via plug portion disposed over the via barrier layer. The via barrier layer is disposed between the first via plug portion and the second via plug portion. The via barrier layer is further disposed between the dielectric layer and the second via plug portion. In some implementations, a material of the first via plug portion is the same as a material of the second via plug portion. In some implementations, a material of the first via plug portion is different than a material of the second via plug portion.

An exemplary interconnect structure includes of a multilayer interconnect (MLI) feature includes a dielectric layer, a cobalt-comprising device-level contact disposed in the dielectric layer, and a partial barrier-free via disposed in the dielectric layer over the cobalt-comprising device-level contact. The partial barrier-free via includes a first via plug portion disposed on and physically contacting the cobalt-comprising device-level contact and the dielectric layer, a second via plug portion disposed over the first via plug portion, and a via barrier layer disposed between the second via plug portion and the first via plug portion. The via barrier layer is further disposed between the second via plug portion and the dielectric layer. In some implementations, the first via plug portion and the second via plug portion include tungsten, cobalt, ruthenium, or combinations thereof. In some implementations, the via barrier layer includes titanium. In some implementations, the via barrier layer includes a first layer that includes titanium and a second layer that includes titanium and nitrogen. In some implementations, wherein the via barrier layer includes tantalum. In some implementations, the via barrier layer includes a first layer that includes tantalum and a second layer that includes tantalum and nitrogen. In some implementations, the dielectric layer includes a first ILD layer, a CESL disposed over the first ILD layer, and a second ILD layer disposed over the CESL. In such implementations, the cobalt-comprising device-level contact is disposed in the first ILD layer. In furtherance of such implementations, the partial barrier-free via is disposed in the CESL and the second ILD layer, such that the first via plug portion physically contacts the ILD layer and the CESL and the via barrier layer physically contacts the ILD layer.

An exemplary method includes forming a via opening in a dielectric layer. The via opening has sidewalls defined by the dielectric layer and a bottom defined by a contact. The method further includes filling the via opening by forming a first via bulk layer, forming a via barrier layer over the first via bulk layer, forming a second via bulk layer over the via barrier layer, and performing a planarization process, such that a remainder of the second via bulk layer, the via barrier layer, and the first via bulk layer form the via. In some implementations, the first via bulk layer is formed by a selective deposition process, and the second via bulk layer is formed by a non-selective deposition process. In some implementations, the selective deposition process and the non-selective deposition process are CVD processes. In some implementations, the planarization process completely removes the second via bulk layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a via opening having a depth in a dielectric layer, wherein the via opening has sidewalls formed by the dielectric layer and a bottom formed by a contact; and
   filling the via opening by:
   forming a first via bulk layer having a first thickness, wherein the first thickness is less than the depth of the via opening,
   forming a via barrier layer having a second thickness over the first via bulk layer, wherein a sum of the first thickness and the second thickness is less than the depth of the via opening,
   forming a second via bulk layer over the via barrier layer, and
   performing a planarization process, such that a remainder of the second via bulk layer, the via barrier layer, and the first via bulk layer form the via.

2. The method of claim 1, wherein the forming the first via bulk layer includes performing a selective deposition process and the forming the second via bulk layer includes performing a non-selective deposition process.

3. The method of claim 2, wherein the selective deposition process and the non-selective deposition process are chemical vapor deposition processes.

4. The method of claim 1, wherein the planarization process modifies a profile of a portion of the via barrier layer that fills the via opening.

5. The method of claim 1, wherein the planarization process modifies a profile of a portion of the second via bulk layer that fills the via opening.

6. The method of claim 1, wherein the forming the first via bulk layer includes filling a bottom portion of the via opening, the forming the via barrier layer includes partially filling a top portion of the via opening, and the forming the second via bulk layer includes filling a remainder of the top portion of the via opening.

7. The method of claim 1, wherein a contact bulk layer of the contact includes a first metal, the first via bulk layer includes a second metal, and the via barrier layer includes a third metal, wherein the first metal, the second metal, and the third metal are different.

8. The method of claim 7, wherein the first metal includes cobalt, the second metal includes tungsten, and the third metal includes titanium.

9. The method of claim 7, wherein the first metal includes cobalt, the second metal includes ruthenium, and the third metal includes titanium.

10. A method comprising:
    forming a first interconnect feature in a dielectric layer;
    forming a via in the dielectric layer, wherein the forming the via includes:
    forming a via opening in the dielectric layer, wherein the via opening exposes the first interconnect feature,
    depositing a first via plug layer in the via opening, wherein the first via plug layer fills a lower portion of the via opening,
    depositing a via barrier layer in the via opening, wherein the via barrier layer is disposed over the first via plug layer, wherein the via barrier layer partially fills an upper portion of the via opening,
    depositing a second via plug layer over the via barrier layer, wherein the second via plug layer partially fills the upper portion of the via opening, and
    performing a planarization process that removes the via barrier layer and the second via plug layer from over a top surface of the dielectric layer; and
    forming a second interconnect feature in the dielectric layer, wherein the via connects the first interconnect feature to the second interconnect feature.

11. The method of claim 10, wherein the planarization process partially removes the second via plug layer that partially fills the upper portion of the via opening.

12. The method of claim 10, wherein the planarization process entirely removes the second via plug layer that partially fills the upper portion of the via opening.

13. The method of claim 10, wherein the planarization process partially removes the via barrier layer that partially fills the upper portion of the via opening.

14. The method of claim 10, wherein the planarization process removes a portion of the via barrier layer that covers a top surface of the first via plug layer.

15. The method of claim 10, wherein the depositing the first via plug layer includes performing a bottom-up deposition process.

16. A method for forming an interconnect structure of a multilayer interconnect (MLI) feature, the method comprising:
    forming a dielectric layer over a substrate;
    forming a cobalt-comprising device-level contact in the dielectric layer; and
    forming a partial barrier-free via in the dielectric layer over the cobalt-comprising device-level contact, wherein the forming the partial barrier-free via includes:
    forming a first via plug portion in the dielectric layer over the cobalt-comprising device-level contact, wherein the first via plug portion physically contacts the dielectric layer,
    forming a via barrier layer in the dielectric layer over the first via plug portion, and
    forming a second via plug portion in the dielectric layer over the via barrier layer, wherein the via barrier layer is disposed between the first via plug portion and the second via plug portion and is further disposed between the second via plug portion and the dielectric layer.

17. The method of claim 16, wherein the forming the first via plug portion includes performing a first deposition process and the forming the second via plug portion includes performing a second deposition process that is different than the first deposition process.

18. The method of claim 16, wherein the forming the via barrier layer and the second via plug portion includes performing a planarization process that recesses the second via plug portion below a top surface of the dielectric layer.

19. The method of claim 16, wherein the forming the via barrier layer and the second via plug portion includes performing a planarization process that completely removes the second via plug portion below a top surface of the dielectric layer.

20. The method of claim 16, wherein the forming the via barrier layer and the second via plug portion includes performing a planarization process that recesses the via barrier layer.

* * * * *